United States Patent [19]

Urban

[11] 4,303,142

[45] Dec. 1, 1981

[54] COMBINED ACOUSTICAL TRANSDUCER AND GRILLE

[75] Inventor: Keith F. Urban, Elk Grove Village, Ill.

[73] Assignee: International Jensen Incorporated, Schiller Park, Ill.

[21] Appl. No.: 176,919

[22] Filed: Aug. 11, 1980

[51] Int. Cl.[3] .............................................. H05K 5/00

[52] U.S. Cl. .................................... 181/144; 181/175

[58] Field of Search ............... 181/144, 148, 149, 145, 181/155, 156, 175, 146, 147, 199; 179/115.5 PS, 116, 1 GA

[56] References Cited

U.S. PATENT DOCUMENTS 4,182,429 1/1980 Senzaki .............................. 181/144

4,196,791 4/1980 Gottlieb ............................. 181/155

*Primary Examiner*—L. T. Hix

*Assistant Examiner*—Benjamin R. Fuller

*Attorney, Agent, or Firm*—Darbo & Vandenburgh

[57] ABSTRACT

An acoustical transducer and grille combined into a single unit. The grille is acoustically transparent and includes a plurality of wave guides separated for through-passage of sound. Situated in the midst of the grille is a mounting for the acoustical transducer. The transducer mounting has a central opening and an annular groove formed about the periphery of the central opening into which the acoustical transducer is mounted. A second acoustical transducer, larger in dimension than the first acoustical transducer, may be employed as well, also mounted within the confines of the grille. For greatest acoustical clarity, the first and second acoustical transducers are coaxially oriented.

6 Claims, 3 Drawing Figures

COMBINED ACOUSTICAL TRANSDUCER AND GRILLE

BACKGROUND OF THE INVENTION

This invention pertains to acoustical systems and in particular a combination of one or more acoustical transducers and a rigid grille into a single unit.

Acoustical transducer or loudspeaker systems, and in particular those used within the confines of an automobile, are typically composed of strategically placed loudspeakers which, when mounted, are covered with a separate grille. Not only does the grille enhance the appearance of the speaker mounting, it also provides an acoustically transparent sound path from the speaker and can, if necessary, provide a means to disperse directly radiating sound emanating from the speaker.

In such speaker systems, the loudspeaker is first mounted within a chosen location in the vehicle. The grille is then attached to the vehicle over the loudspeaker, often by fasteners which attach the grille to the vehicle structure adjacent to the loudspeaker.

Several problems occur with the separate grille/loudspeaker systems of the prior art. First, because the grille and loudspeaker are separate, the orientation of the grille over the loudspeaker is variable and if improper, could affect the sound quality. Secondly, the spacing between the loudspeaker and the grille is dictated by the means of installation of the two elements, again, if improper, possibly leading toreduction in the overall quality of the sound. Thirdly, because the loudspeaker and grille are separate, the overall depth of the combination of the two usually is greater than were the two combined, a sometimes critical dimension when installed within the tight confines of a vehicle. Fourthly, because the speaker and grille are separate, extra installation steps must be taken to mount each within the vehicle, increasing labor costs and the chances for improper placement of the speaker and grille.

SUMMARY OF THE INVENTION

The above deficiencies of the prior art and others are overcome by the present invention which combines one or more acoustical transducers and the speaker grille into a single unit. The grille is rigid and acoustically transparent and includes a plurality of wave guides separated for through-passage of sound. A transducer mounting is situated in the midst of the grille, located within the confines of the wave guides, and includes a central aperture and a groove formed around the periphery of the aperture for mounting of an acoustical transducer. The acoustical transducer is dimensioned the same as the groove and is directly bonded thereto.

A second acoustical transducer of greater size than the first transducer may also be attached to the grille. To accommodate the second acoustical transducer, the grille includes a recess for the second transducer. Preferably, the first and second transducers are coaxially aligned.

The first acoustical transducer, being smaller, normally is a direct radiating tweeter. To disperse sound emanating from the tweeter, appropriate wave guides may also span the central aperture of the transducer mounting. Thus, the entire vehicle will be filled with the dispersed sound, rather than merely portions in line with the tweeter.

BRIEF DESCRIPTION OF THE DRAWING

The salient features of the invention will become more apparent in the following detailed description of the preferred embodiment of the invention, taken in conjunction with the drawing, in which.

DESCRIPTION OF THE PREFERRED EMBODIMENT

Figure 1:
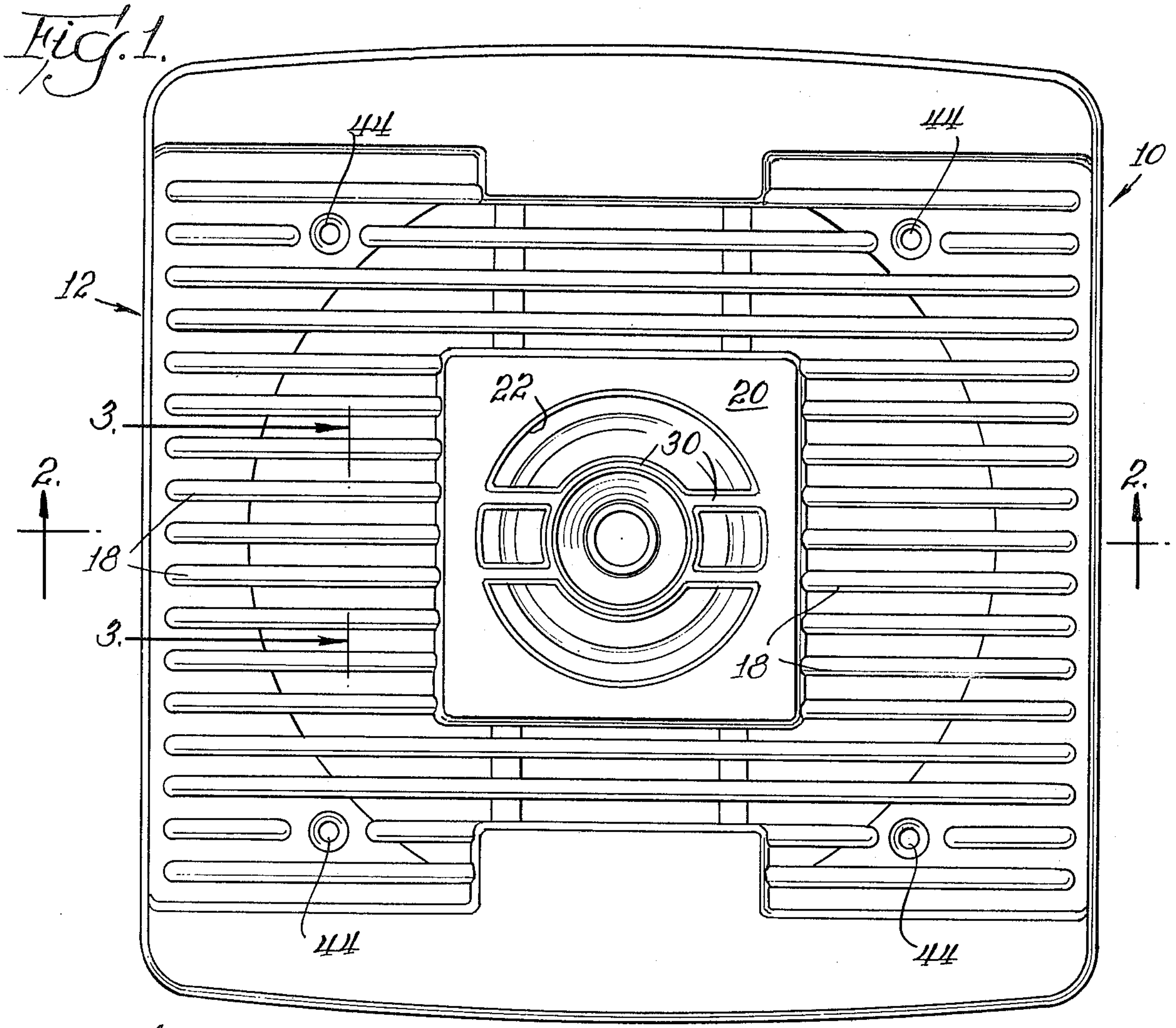
FIG. 1 is a front plan view of the grille of the invention with a pair of coaxially oriented acoustical transducers attached to the underside.

Turning to the drawing, the combined structure of the invention is illustrated generally at 10. Primary components are an acoustically transparent, rigid grille 12, a first acoustical transducer 14, and a second, larger acoustical transducer 16.

The grille 12 includes a series of parallel wave guides 18 which are separated for through-passage of sound. The wave guides 18 are integrally molded within the grille 12, as illustrated, and the entire grille structure may be fabricated from plastic or other suitable material.

Figure 2:
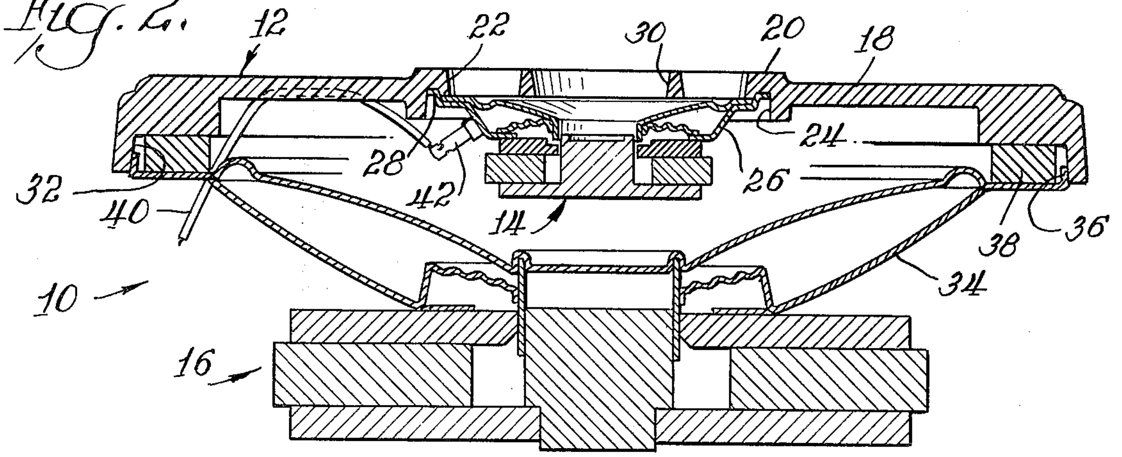
FIG. 2 is a cross-sectional illustration taken along lines 2—2 of FIG. 1.

A transducer mounting 20 for the first acoustical transducer 14 is located within the confines of the wave guides 18. As illustrated, the transducer mounting 20 includes a central aperture 22 and an annular groove 24 formed about the periphery of the central aperture 22. As shown in FIG. 2, the annular groove 24 opens toward the rear side of the grille 12, while the mounting 20 protrudes outwardly from the front side of the grille 12, thus permitting the first acoustical transducer to be mounted as close to the front side of the grille as desired.

The first acoustical transducer 14, which may be of conventional design and therefore is not described in detail, is dimensioned so that it fits within the annular groove 24. The basket 26 of the transducer 14 includes a flange 28 which is cemented or otherwise bonded to the groove 24. Thus, the transducer 14 is immobily and permanently installed within the transducer mounting 20.

As best illustrated in FIG. 1, a wave guide 30 may span the aperture 22. Since the acoustical transducer 14 typically is a direct radiating tweeter, the wave guide 30 may be used to disperse sound emanating from the transducer 14 to better fill the vehicle space in which the invention 10 is mounted.

The second acoustical transducer 16 is shown attached to a recess 32 formed in the grille 12. The transducer 16 also may be of conventional design, and therefore will not be described in detail. The basket 34 of the acoustical transducer 16 includes a flange 36 which is cemented or otherwise bonded to the recess 32. A gasket 38 may be employed to seal the juncture between the transducer 16 and the grille 12.

Due to its larger size, the acoustical transducer 16 is commonly a woofer when employed in combination with the acoustical transducer 14, and, for the purposes of sound clarity and dispersion, is preferably coaxially oriented with the first acoustical transducer 14, as illustrated in FIG. 2. As space dictates, however, the two transducers 14 and 16 can be otherwise situated within the structure of the grille 12 as will be apparent to those skilled in the art.

Figure 3:
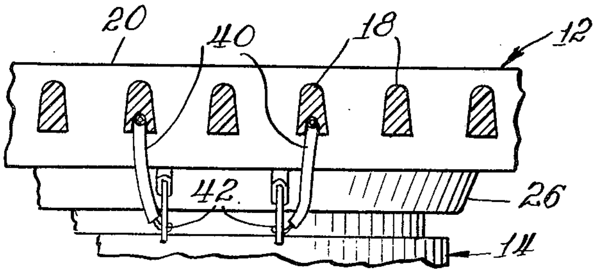
FIG. 3 is an enlarged cross-sectional illustration taken along lines 3—3 of FIG. 1.

FIG. 3 illustrates some of the wave guides 18 in cross section. The wave guides 18 are separated sufficiently so that the portions of the grille above the transducer 16 are essentially acoustically transparent. Those portions of the grille 12 not above the transducer 16, that is, outside the periphery of the transducer 16, may be solid between the wave guides 18 since acoustical transparency is not required and could be undesirable. The design of the grille 12 also provides an attractive facade for the structure of the invention.

Also shown in FIG. 3 are wire leads 40 leading from connectors 42 attached to the basket 26 of the acoustical transducer 14. The wire leads 40 pass through an aperture (not illustrated) in the acoustical transducer 16 and are attached to a conventional acoustical source (not illustrated). In the usual manner, the leads 40 provide electrical impulses to drive the acoustical transducer 14 to reproduce sound.

Since the transducers 14 and 16 and grille 12 are combined into a single unit, installation is relatively simple. The grille 12 may be provided with mounting holes 44 through which fasteners (not illustrated) pass to fasten the structure to any desired surface.

ACHIEVEMENTS

By providing a combination of the grille 12 and the acoustical transducers 14 and 16, the invention produces a loudspeaker structure of uniformity of sound reproduction and ease of installation. Also, the combined structure, due to its unique configuration, is quite thin and will fit in many locations not available to prior art separate speaker and grille combinations.

By mounting the acoustical transducer 14 in the crest of the grille 12, and utilization of the wave guides 30, high frequencies, which normally travel in a straight direction, are dispersed throughout the vehicle in which the invention 10 is employed.

Not only is installation easier due to the unitary nature of the invention, since the acoustical transducers are bonded directly to the grille 12, the invention produces a sturdier speaker with less vibration and annoying rattles.

While the preferred embodiment of the invention has been described above, it will be obvious to others skilled in the art that various changes can be made without departing from the spirit of the invention or scope of the following claims.

What is claimed is:

1. A combined acoustical transducer and grille comprising a. an acoustically transparent, rigid grille having an exposed front side and a rear side for mounting of an acoustical transducer and including a plurality of wave guides separated for through-passage of sound, b. a transducer mounting situated in the midst of said grille and located within the confines of said wave guides, said transducer mounting including a central aperture and an annular groove formed about the periphery of said central aperture, said groove being open toward the rear side of said grille, c. an acoustical transducer having a peripheral dimension approximately equal to the dimensions of said groove, d. means attaching said acoustical transducer to said groove, and e. a second wave guide spanning said central aperture to disperse sound emanating from said acoustical transducer.

2. The combination according to claim 1 further including a second acoustical transducer of greater dimension than the first-mentioned acoustical transducer, said second acoustical transducer being attached to the rear side of said rigid grille within the margins thereof.

3. The combination according to claim 2 in which the rear side of said rigid grille includes a recess into which said second acoustical transducer is attached.

4. The combination according to claim 2 in which said first and second acoustical transducers are coaxially oriented.

5. The combination according to claim 1 in which said transducer mounting protrudes outwardly from the front side of said rigid grille.

6. The combination according to claim 1 in which said wave guides are parallel.

* * * * *